US011923370B2

(12) United States Patent
Sung et al.

(10) Patent No.: US 11,923,370 B2
(45) Date of Patent: Mar. 5, 2024

(54) FORKSHEET TRANSISTORS WITH DIELECTRIC OR CONDUCTIVE SPINE

(71) Applicant: Intel Corporation, Santa Clara, CA (US)

(72) Inventors: Seung Hoon Sung, Portland, OR (US); Cheng-Ying Huang, Portland, OR (US); Marko Radosavljevic, Portland, OR (US); Christopher M. Neumann, Portland, OR (US); Susmita Ghose, Hillsboro, OR (US); Varun Mishra, Hillsboro, OR (US); Cory Weber, Hilsboro, OR (US); Stephen M. Cea, Hillsboro, OR (US); Tahir Ghani, Portland, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 649 days.

(21) Appl. No.: 17/030,226

(22) Filed: Sep. 23, 2020

(65) Prior Publication Data
US 2022/0093647 A1    Mar. 24, 2022

(51) Int. Cl.
*H01L 27/12*      (2006.01)
*H01L 21/84*      (2006.01)

(52) U.S. Cl.
CPC .......... *H01L 27/1203* (2013.01); *H01L 21/84* (2013.01)

(58) Field of Classification Search
CPC ........................... H01L 27/1203; H01L 21/84
USPC ......................................................... 361/783
See application file for complete search history.

(56) References Cited

U.S. PATENT DOCUMENTS

2019/0393356 A1* 12/2019 Le ..................... H01L 29/78603
2020/0006575 A1*  1/2020 Dewey ................ H01L 29/7869

\* cited by examiner

*Primary Examiner* — Andargie M Aychillhum
(74) *Attorney, Agent, or Firm* — Schwabe, Williamson & Wyatt, P.C.

(57) ABSTRACT

Embodiments disclosed herein include forksheet transistor devices having a dielectric or a conductive spine. For example, an integrated circuit structure includes a dielectric spine. A first transistor device includes a first vertical stack of semiconductor channels spaced apart from a first edge of the dielectric spine. A second transistor device includes a second vertical stack of semiconductor channels spaced apart from a second edge of the dielectric spine. An N-type gate structure is on the first vertical stack of semiconductor channels, a portion of the N-type gate structure laterally between and in contact with the first edge of the dielectric spine and the first vertical stack of semiconductor channels. A P-type gate structure is on the second vertical stack of semiconductor channels, a portion of the P-type gate structure laterally between and in contact with the second edge of the dielectric spine and the second vertical stack of semiconductor channels.

20 Claims, 11 Drawing Sheets

FORKSHEET TRANSISTORS WITH DIELECTRIC OR CONDUCTIVE SPINE

TECHNICAL FIELD

Embodiments of the present disclosure relate to integrated circuit structures, and more particularly to forksheet transistors for use in integrated circuitry.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In another aspect, maintaining mobility improvement and short channel control as microelectronic device dimensions scale below the 10 nanometer (nm) node provides a challenge in device fabrication. Nanowires used to fabricate devices provide improved short channel control.

Scaling multi-gate and nanowire transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

EMBODIMENTS OF THE PRESENT DISCLOSURE

Figure 1A:
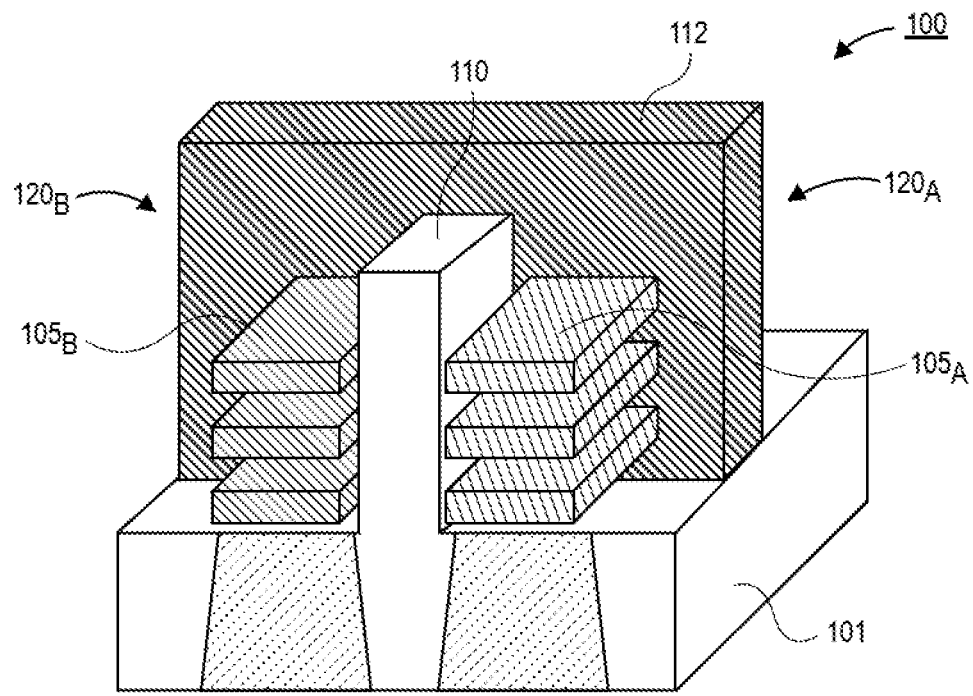
FIG. 1A is a perspective view illustration of forksheet transistors, in accordance with an embodiment.

Described herein are forksheet transistors having a dielectric or a conductive spine, and methods of fabricating forksheet transistors having a dielectric or a conductive spine. In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions or context for terms found in this disclosure (including the appended claims):

"Comprising." This term is open-ended. As used in the appended claims, this term does not foreclose additional structure or operations.

"Configured To." Various units or components may be described or claimed as "configured to" perform a task or tasks. In such contexts, "configured to" is used to connote structure by indicating that the units or components include structure that performs those task or tasks during operation. As such, the unit or component can be said to be configured to perform the task even when the specified unit or component is not currently operational (e.g., is not on or active). Reciting that a unit or circuit or component is "configured to" perform one or more tasks is expressly intended not to invoke 35 U.S.C. § 112, sixth paragraph, for that unit or component.

"First," "Second," etc. As used herein, these terms are used as labels for nouns that they precede, and do not imply any type of ordering (e.g., spatial, temporal, logical, etc.).

"Coupled." The following description refers to elements or nodes or features being "coupled" together. As used herein, unless expressly stated otherwise, "coupled" means that one element or node or feature is directly or indirectly joined to (or directly or indirectly communicates with) another element or node or feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation or location or both of portions of the component within a consistent but arbitrary frame of reference which is made clear by reference to the text and the associated drawings describing the component under discussion. Such terminology may include the words specifically mentioned above, derivatives thereof, and words of similar import.

"Inhibit." As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, or effect which might otherwise occur. Accordingly, when a component, element, or feature is referred to as inhibiting a result or state, it need not completely prevent or eliminate the result or state.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) become interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

Various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

One or more embodiments described herein are directed to self-aligned nanoribbon structures with a dielectric spine, which may be viewed as a version of forksheet (or nanocomb) transistors. One or more embodiments described herein are directed to forksheet (or nanocomb) transistors having a Faraday shield, which may include a conductive spine.

To provide context, to continue cell size scaling, nanowires/nanoribbons, self-aligned dielectric wall (or self-aligned gate end, SAGE), and stacked transistors are three feasible boosters to continue cell size scaling. Unlike FinFETs, nanowire or nanoribbon structure allows higher drive current per footprint because of its stackability. A self-aligned gate end (SAGE) uses a dielectric wall to separate NMOS and PMOS, thus reducing the gate extension over active fins and the spacing of N-P boundary. Nanocomb transistor architecture combines both nanoribbon channels with a self-aligned dielectric wall to aggressively scale the cell height in a 2-D CMOS.

To provide further context, in order to combat the demands of spacing between features, a forksheet transistor architecture has been proposed. In a forksheet architecture, a dielectric backbone or spine is disposed between a first transistor and a second transistor. The semiconductor channels (e.g., ribbons, wires, etc.) of the first transistor and the second transistor contact opposite sidewalls of the dielectric spine. As such, the spacing between the first transistor and the second transistor is reduced to the width of the dielectric spine. Since one surface of the semiconductor channels contacts the dielectric spine, such architectures do not allow for gate all around (GAA) control of the semiconductor channels. Additionally, compact interconnect architectures between the first transistor and the second transistor have yet to be proposed.

As noted above, forksheet transistors allow for increased density of non-planar transistor devices. An example of semiconductor device 100 with forksheet transistors 120A and 120E is shown in FIG. 1A. A forksheet transistor includes a dielectric spine 110 that extends up from a substrate 101 with a transistor 120 adjacent to the either sidewall of the dielectric spine 110. As such, the spacing between transistors 120A and 120E is equal to the width of the dielectric spine 110. Therefore, the density of such forksheet transistors 120 can be increased compared to other non-planar transistor architectures (e.g., fin-FETs, nanowire transistors, etc.).

Sheets 105 of semiconductor material extend away (laterally) from the dielectric spine 110. In the illustration of FIG. 1A, sheets 105A and 105E are shown on either side of the dielectric spine 110. The sheets 105A are for the first transistor 120A and the sheets 105E are for the second transistor 120B. The sheets 105A and 105E pass through a gate structure 112. The portions of the sheets 105A and 105E within the gate structure 112 are considered the channel, and the portions of the sheets 105A and 105E on opposite sides of the gate structure 112 are considered source/drain regions. In some implementations, the source/drain regions include an epitaxially grown semiconductor body, and the sheets 105 may only be present within the gate structure 112. That is, the stacked sheets 105A and 105E are replaced with a block of semiconductor material.

Figure 1B:
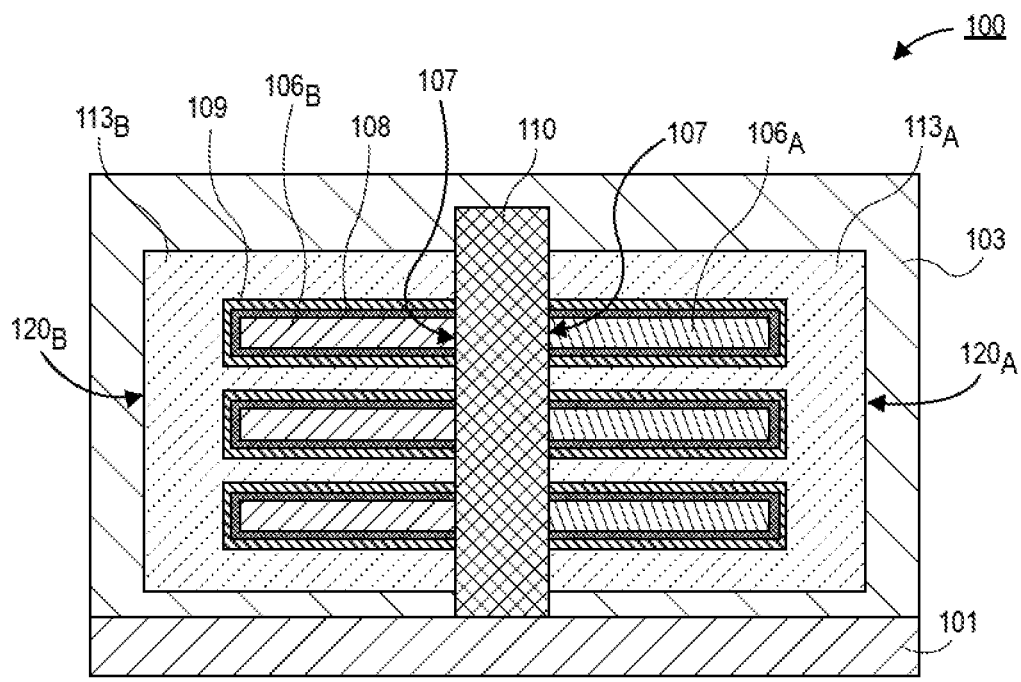
FIG. 1B is a cross-sectional illustration of forksheet transistors across the semiconductor channels, in accordance with an embodiment.

Referring now to FIG. 1B, a cross-sectional illustration of the semiconductor device 100 through the gate structure 112 is shown. As shown, vertical stacks of semiconductor channels 106A and 106E are provided through the gate structure 112. The semiconductor channels 106A and 106E are connected out of the plane of FIG. 1B to the source/drain regions. The semiconductor channels 106A and 106E are surrounded on three sides by a gate dielectric 108. The surfaces 107 of the semiconductor channels 106A and 106E are in direct contact with the dielectric spine 110. A workfunction metal 109 may surround the gate dielectric 108, and a gate fill metal 113A and 113E may surround the workfunction metal 109. In the illustration, the semiconductor channels 106A and 106E are shown as having different shading. However, in some implementations, the semiconductor channels 106A and 106E may be the same material. An insulator layer 103 may be disposed over the gate fill metals 113A and 113B.

While such forksheet transistors 120A and 120E provide many benefits, there are still many areas for improvement in order to provide higher densities, improved interconnection architectures, and improved performance. For example, embodiments disclosed herein provide further density improvements by stacking a plurality of transistor strata over each other. Whereas the semiconductor device 100 in FIGS. 1A and 1B illustrate a single strata (i.e., a pair of adjacent forksheet transistors 120A and 120B), embodiments disclosed herein include a first strata and a second strata (e.g., to provide four forksheet transistors) within the same footprint illustrated in FIGS. 1A and 1B. Additionally, embodiments disclosed herein provide interconnect architectures that allow for electrical coupling between the first strata and the second strata to effectively utilize the multiple strata. Additionally, embodiments disclosed herein include interconnect architectures that allow for bottom side connections to the buried strata.

In an embodiment a material for a dielectric spine may be composed of a material suitable to ultimately electrically isolate, or contribute to the isolation of, active regions of neighboring transistor devices. For example, in one embodiment, a dielectric spine is composed of a dielectric material such as, but not limited to, silicon dioxide, silicon oxynitride, silicon nitride, or carbon-doped silicon nitride. In embodiments, a dielectric spine is composed of or includes a dielectric such as an oxide of silicon (e.g., silicon dioxide ($SiO_2$)), a doped oxide of silicon, a fluorinated oxide of silicon, a carbon doped oxide of silicon, a low-k dielectric material known in the art, and combinations thereof. The dielectric spine material may be formed by a technique, such as, for example, chemical vapor deposition (CVD), physical vapor deposition (PVD), or by other deposition methods. In embodiments, a dielectric spine is composed of a high-k layer together with a low-k layer, e.g., where the high-k portion is included for hardness.

In a first aspect, in accordance with one or more embodiments of the present disclosure, self-aligned nanoribbon structures with dielectric spines are described.

A nanocomb architecture described below can be implemented to enable self-aligned gate edge and SRAM scaling. In addition, this architecture relaxes the challenges of metal gate formation and wrap-around-contacts in stacked nanowire or nanoribbon architectures. As an example, FIG. 2 illustrates a cross-sectional view of an integrated circuit structure including a forksheet or nanocomb transistor with a dielectric spine, in accordance with an embodiment of the present disclosure.

Figure 2:
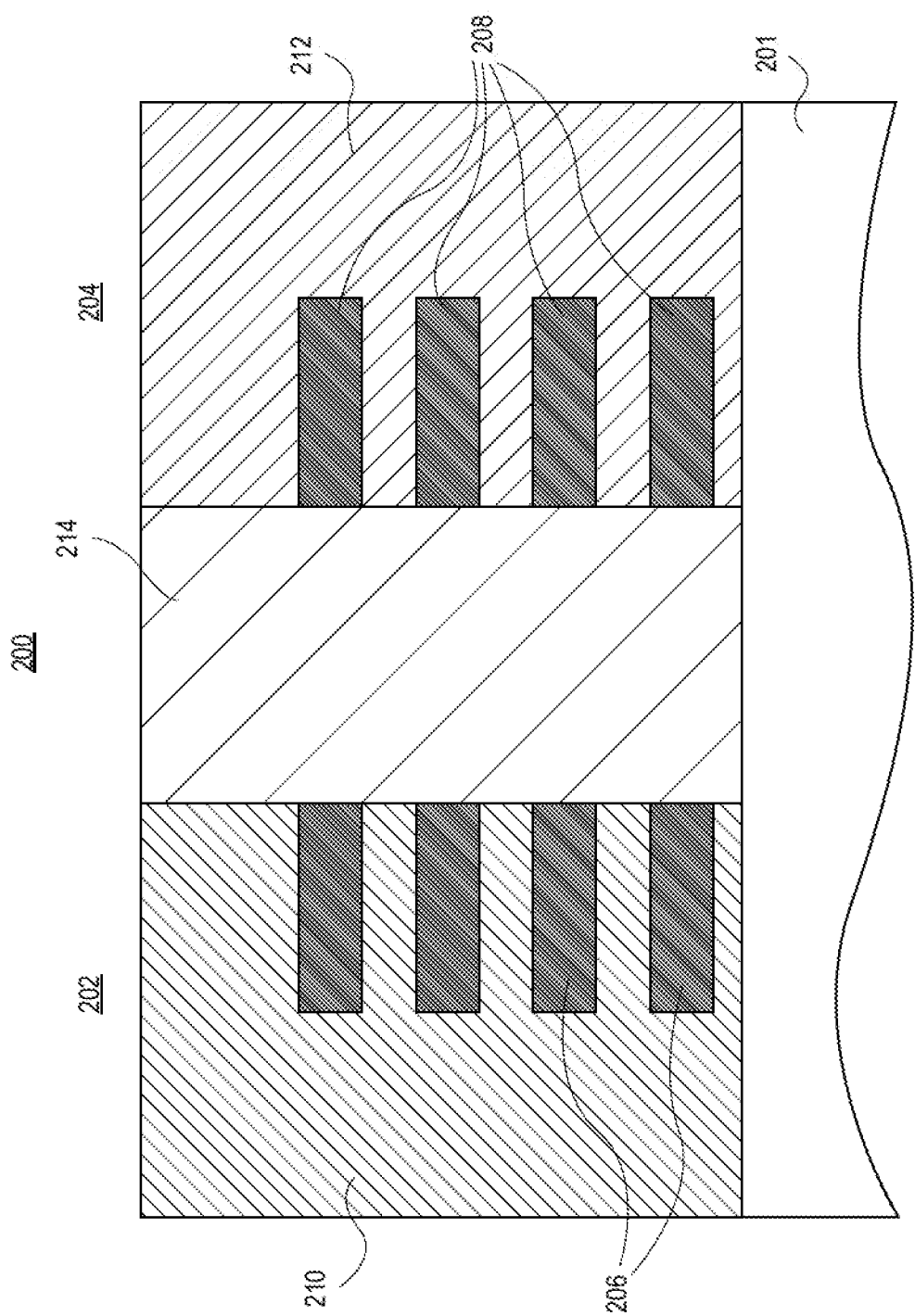
FIG. 2 illustrates a cross-sectional view of an integrated circuit structure including a forksheet transistor with a dielectric spine, in accordance with an embodiment of the present disclosure.

Referring to FIG. 2, an integrated circuit structure 200 includes a PMOS region 202 and an NMOS region 204 above a substrate 201, such as a silicon substrate. The PMOS region 202 includes a stack of nanowires or nanoribbons 206 and a P-type metal gate electrode 210. The NMOS region 204 includes a stack of nanowires or nanoribbons 208 and an N-type metal gate electrode 212. A dielectric spine 214 is between the PMOS region 202 and the NMOS region 204. In one embodiment, the dielectric spine 214 is in contact with the nanowires or nanoribbons 206 of the PMOS region 202 and is in contact with the nanowires or nanoribbons 208 of the NMOS region 204, as is depicted.

It is to be appreciated that the architecture of FIG. 2 may be associated with problems of loss of short channel effects (SCE), which is otherwise a key advantage of gate all around (GAA) architectures, and electrical coupling between nMOS and pMOS. Attempts to improve SCEs for architectures such as described in association with FIG. 2 have included attempts to improve interface quality by engineering efforts such as nitridation and so on to compensate the loss of SCE. Also, a recessed spine has been implemented to improve SCEs. However, improvements can still be made, especially since they do not provide a path to block or suppress electrical coupling issues. By contrast, in accordance with embodiments of the present disclosure, a self-aligned space for accommodating HiK/metal gate between one-side edge of the nanoribbons and the dielectric spine to improve SCEs and screen the electrical coupling between NMOS and PMOS. As an example, FIG. 3 illustrates a cross-sectional view of another integrated circuit structure including a forksheet transistor or self-aligned nanoribbon transistor with a dielectric spine, in accordance with another embodiment of the present disclosure.

Figure 3:
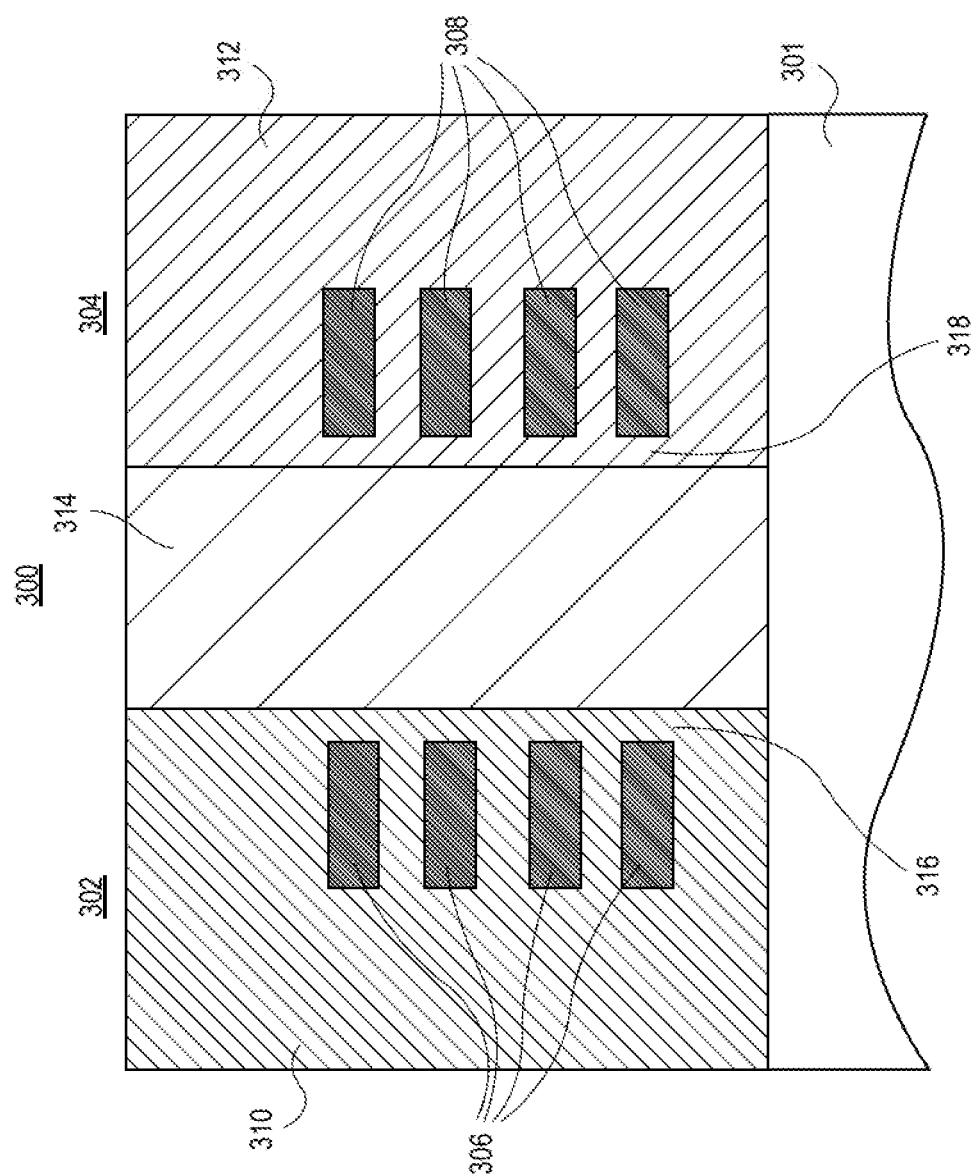
FIG. 3 illustrates a cross-sectional view of another integrated circuit structure including a forksheet transistor with a dielectric spine, in accordance with another embodiment of the present disclosure.

Referring to FIG. 3, an integrated circuit structure 300 includes a PMOS region 302 and an NMOS region 304 above a substrate 301, such as a silicon substrate. The PMOS region 302 includes a stack of nanowires or nanoribbons 306 and a P-type metal gate electrode 310. The NMOS region 304 includes a stack of nanowires or nanoribbons 308 and an N-type metal gate electrode 312. A dielectric spine 314 is between the PMOS region 302 and the NMOS region 304. In one embodiment, the dielectric spine 314 is spaced apart from the nanowires or nanoribbons 306 of the PMOS region 302 and is spaced apart from the nanowires or nanoribbons 308 of the NMOS region 304, as is depicted. In one such embodiment, the P-type metal gate electrode 310 is laterally between the dielectric spine 314 and the nanowires or nanoribbons 306 of the PMOS region 302. The N-type metal gate electrode 312 is laterally between the dielectric spine 314 and the nanowires or nanoribbons 308 of the NMOS region 304.

With reference again to FIG. 3, an integrated circuit structure includes a dielectric spine 314. A first transistor device includes a first vertical stack of semiconductor channels 306 spaced apart from a first edge of the dielectric spine 314. A second transistor device includes a second vertical stack of semiconductor channels 308 spaced apart from a second edge of the dielectric spine 314. An N-type gate structure 310 is on the first vertical stack of semiconductor channels 306, a portion 316 of the N-type gate structure 310 laterally between and in contact with the first edge of the dielectric spine 314 and the semiconductor channels of the first vertical stack of semiconductor channels 306. A P-type gate structure 312 is on the second vertical stack of semiconductor channels 308, a portion 318 of the P-type gate structure 312 laterally between and in contact with the second edge of the dielectric spine 314 and the semiconductor channels of the second vertical stack of semiconductor channels 308.

In an embodiment, the N-type gate structure 310 includes a first gate electrode and a first gate dielectric. In one such embodiment, the portion 316 of the N-type gate structure 310 laterally between and in contact with the first edge of the dielectric spine 314 and the semiconductor channels of the first vertical stack of semiconductor channels 306 includes a portion of the first gate electrode and a portion of the first gate dielectric. In an embodiment, the P-type gate structure 312 includes a second gate electrode and a second gate dielectric. In one such embodiment, the portion 318 of the P-type gate structure 312 laterally between and in contact with the second edge of the dielectric spine 314 and the semiconductor channels of the second vertical stack of semiconductor channels 308 includes a portion of the second gate electrode and a portion of the second gate dielectric.

In accordance with one or more embodiments of the present disclosure, a gate-all-around process flow is followed through shallow trench isolation (STI) recess. A self-aligned SiGe epi cap which grows only Si and SiGe surface can be used. Spine fill follows and isotropic recess etch fills the space between NMOS and PMOS.

Conventional process operations can then be implemented to complete the devices. It is to be appreciated that there may be ways to implement a sacrificial cap without an epi process but the SiGe process can add the feature of self-alignment by nature. Also, the SiGe cap process eliminates an extra dimple etch to fabricate an internal spacer. Otherwise, an extra dimple etch to incorporate low-k spacer to the sacrificial cap may be needed.

A process may include self-aligned cap formation and spine fill. As an example, FIG. 4 illustrates cross-sectional views representing various operations in a method of fabricating an integrated circuit structure including a forksheet transistor with a dielectric spine, in accordance with an embodiment of the present disclosure.

Figure 4:
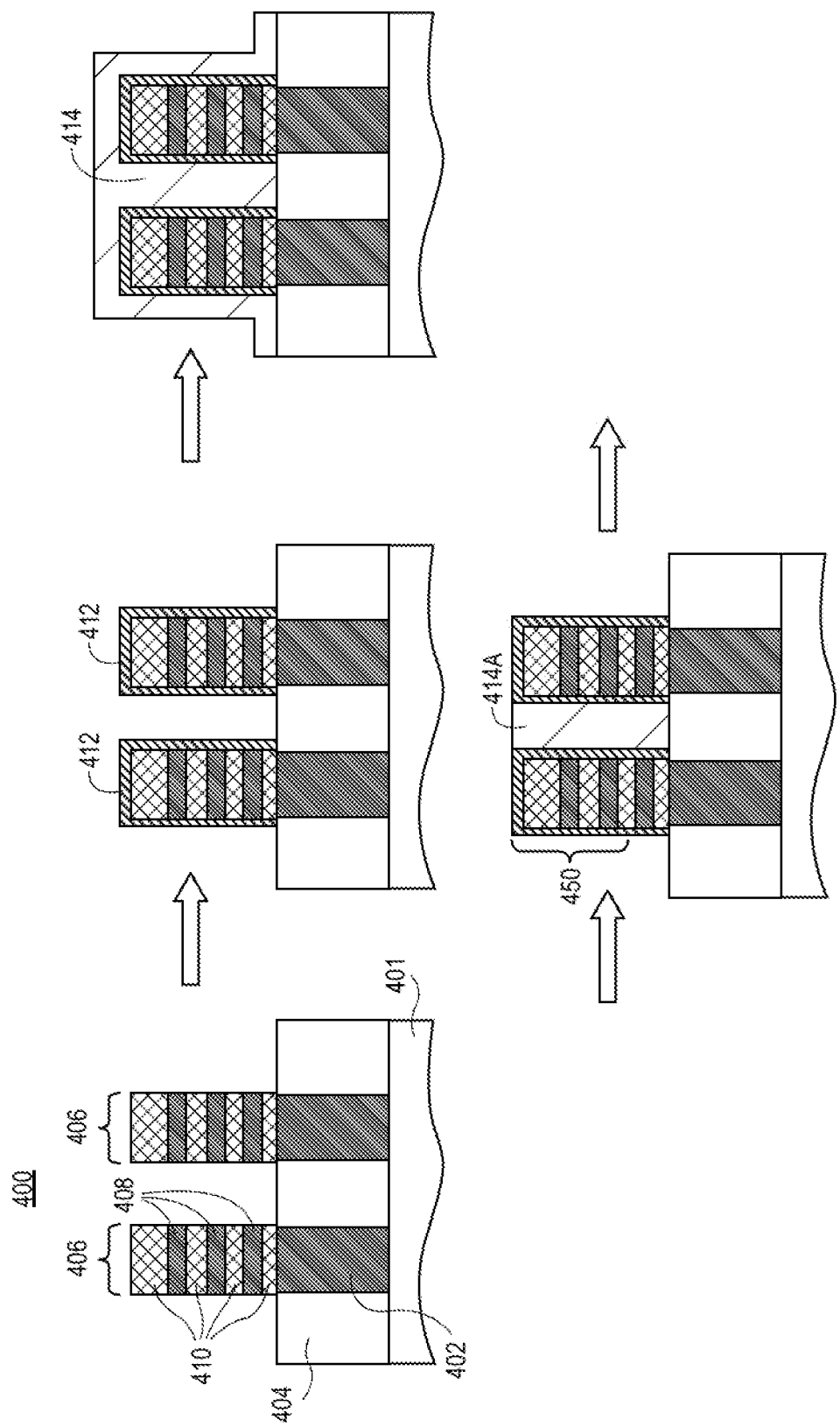
FIG. 4 illustrates cross-sectional views representing various operations in a method of fabricating an integrated circuit structure including a forksheet transistor with a dielectric spine, in accordance with an embodiment of the present disclosure.

Referring to FIG. 4, a starting structure 400 includes silicon subfins 402 in an insolation layer 404 above a substrate 401. Fin stacks 406 are over the silicon subfins 402. The fin stacks 406 each include silicon nanowires 408 with intervening sacrificial silicon germanium layers 410. A sacrificial cap 412, such as a silicon germanium cap is formed over the starting structure 400. A dielectric material 414 is then formed. The dielectric material 414 is patterned to form a stack 450 including a dielectric spine 414A. Subsequent processing may then be performed, as is described below.

Figure 5:
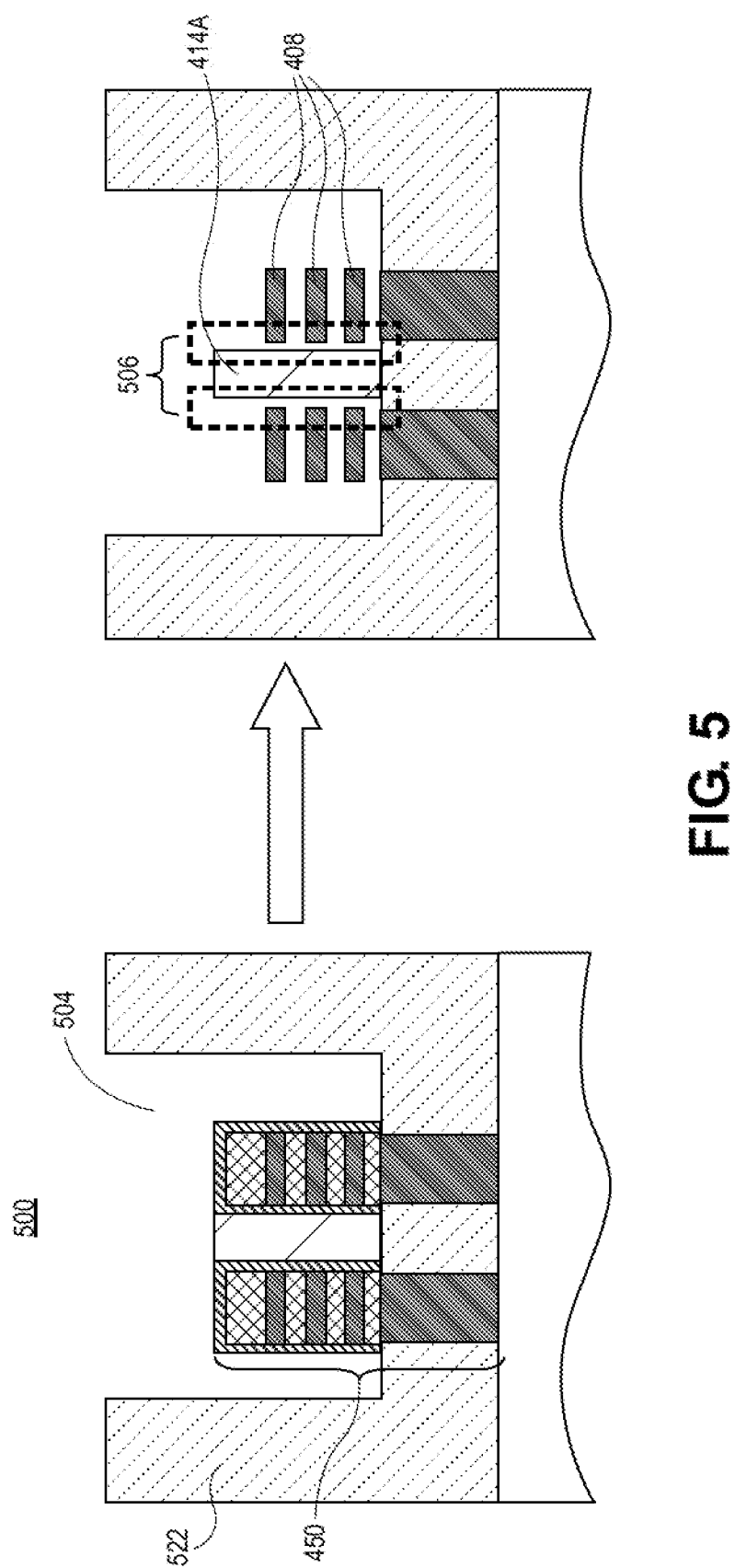
FIG. 5 illustrates cross-sectional views representing various operations in a method of fabricating an integrated circuit structure including a forksheet transistor with a dielectric spine, in accordance with an embodiment of the present disclosure.

FIG. 5 illustrates cross-sectional views representing various operations in a method of fabricating an integrated circuit structure including a forksheet transistor with a dielectric spine, in accordance with an embodiment of the present disclosure.

Referring to FIG. 5, a starting structure 500 includes stack 450 of FIG. 4 in a gate trench 504 in a dielectric layer 522 after a dummy gate removal process. The sacrificial cap 412 and the sacrificial silicon germanium layers 410 of stack 450 are then removed. The resulting structure leaves gaps 506 between the silicon nanowires 408 and the dielectric spine 414A. Subsequent gate stack formation can provide gate material in the gaps 506 between the silicon nanowires 408 and the dielectric spine 414A, e.g., to provide a structure such as described in association with FIG. 3.

In another aspect, in accordance with one or more embodiments of the present disclosure, nanocomb transistors with a Faraday shield are described.

To provide context, a nano-comb transistor (or forksheet transistor) architecture is a viable option for cell height scaling. A nanocomb architecture can be used with nanoribbon transistors in combination with a self-aligned dielectric wall to reduce the spacing of NMOS and PMOS boundary. However, a thin dielectric wall can cause dynamic threshold voltage fluctuation because of the capacitance coupling effect through a thin dielectric wall from the adjacent gate. This might cause malfunctions on CMOS logic gates if the transistor threshold voltage is interfered by its nearby devices. A forksheet/nanocomb transistor can have significant cross interference due to the close proximity between NMOS and PMOS. When the dielectric wall becomes narrower, the adjacent gate can be viewed as a back gate that is coupled through the dielectric wall to the Si channel on the other side. This can cause dynamic Vt fluctuation and result in malfunctions on CMOS circuits.

Addressing such issues, in an embodiment, a Faraday shield is fabricated in the dielectric wall, where the wall is filled with conductive materials to provide a conductive spine. In one embodiment, the conductive material is then grounded so that it can screen the electric field from the neighboring devices, thus preventing cross-interference between adjacent NMOS or PMOS. In an embodiment, the grounded wall is capable of preventing cross-interference from the neighboring devices. Thus, embodiments may be implemented to resolve cross-interference issue in a nanocomb transistor architecture.

Figure 6:
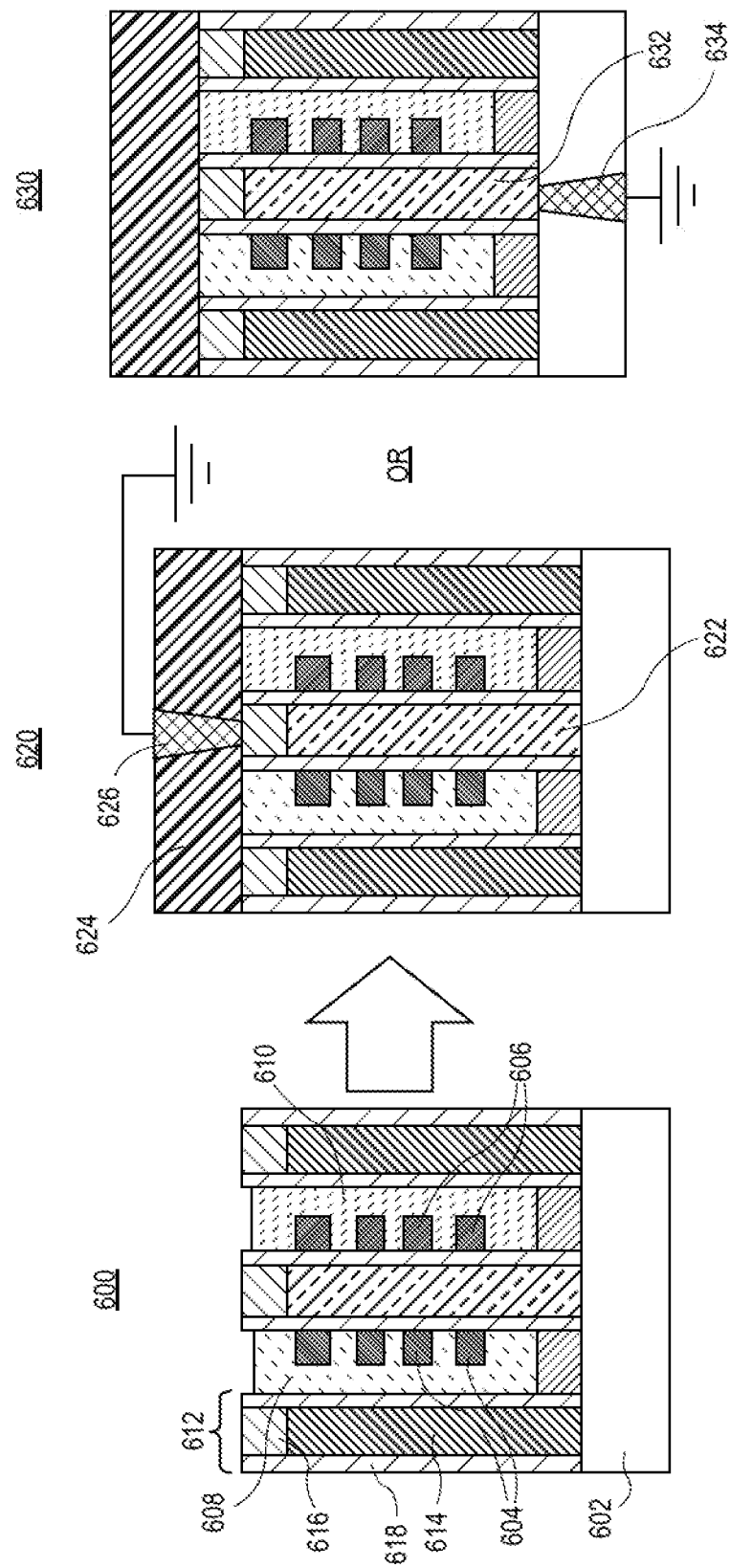
FIG. 6 illustrates cross-sectional views representing various operations in a method of fabricating an integrated circuit structure including a forksheet transistor with a conductive spine, in accordance with an embodiment of the present disclosure.

FIG. 6 illustrates cross-sectional views representing various operations in a method of fabricating an integrated circuit structure including a forksheet transistor with a conductive spine, in accordance with an embodiment of the present disclosure.

A starting structure 600 includes a region with nanowires or nanoribbons 604 and an NMOS gate stack 608 above a substrate 602, and a region with nanowires or nanoribbons 606 and a PMOS gate stack 610 above the substrate 602. Dielectric structures 612 are on either side of and between the two regions. Each dielectric structure 612 includes a dielectric cap 616 on a dielectric wall 614 with adjacent dielectric spacers 618.

Referring again to FIG. 6, a first option structure 620 includes a conductive spine 622 in place of the dielectric cap 616 and dielectric wall 614 of the dielectric structure 612 between the two regions. A conductive contact 626 in a dielectric layer 624 is formed in electrical contact with the conductive spine 622. A second option structure 630 includes a conductive spine 632 in place of the dielectric wall 614 of the dielectric structure 612 between the two regions. A conductive contact 634 in the substrate 602 or in a dielectric layer is formed in electrical contact with the conductive spine 632.

With reference again to FIG. 6, in accordance with an embodiment of the present disclosure, an integrated circuit structure includes a conductive spine 622 or 632. First and second dielectric spacers 618 are along first and second edges of the conductive spine 622 or 632, respectively. A first transistor device includes a first vertical stack of semiconductor channels 604 adjacent to the first dielectric spacer 618 along the first edge of the conductive spine 622 or 632. A second transistor device includes a second vertical stack of semiconductor channels 604 adjacent to the second dielectric spacer 618 along the second edge of the conductive spine 622 or 632.

Figure 7:
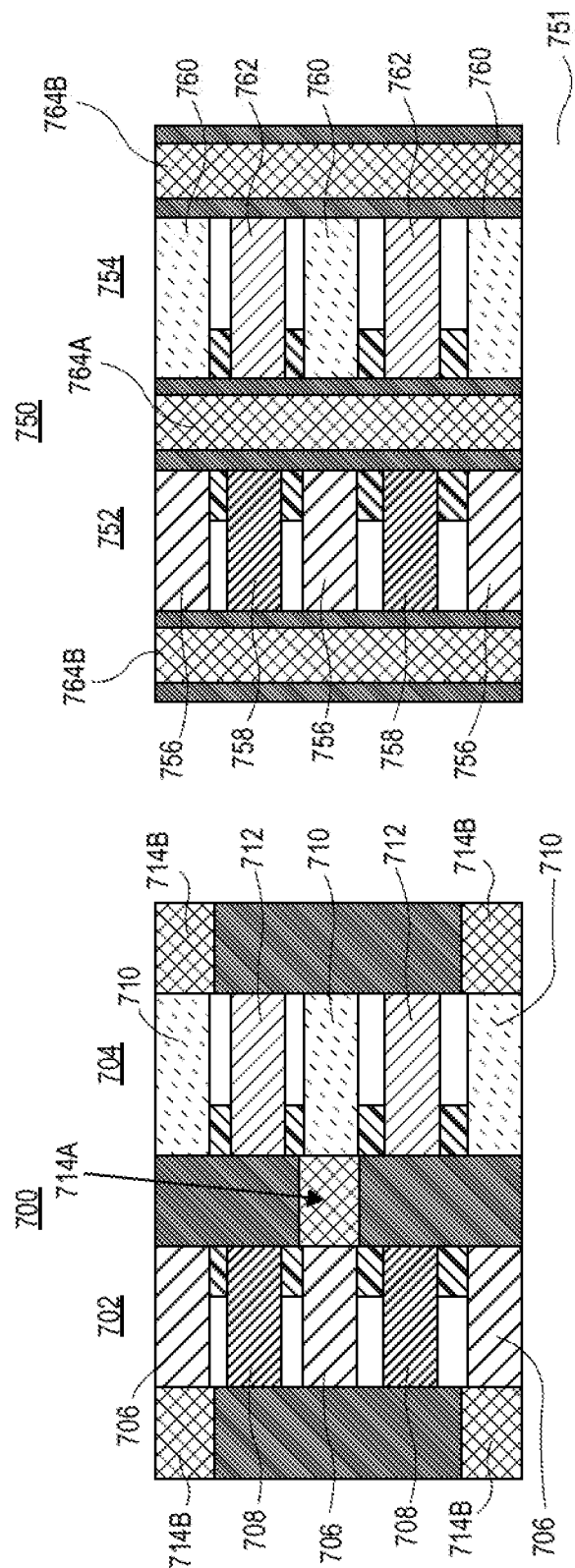
FIG. 7 illustrates plan views representing various architectures for an integrated circuit structure including a forksheet transistor with a conductive spine, in accordance with an embodiment of the present disclosure.

FIG. 7 illustrates plan views representing various architectures for an integrated circuit structure including a forksheet transistor with a conductive spine, in accordance with an embodiment of the present disclosure.

Referring to FIG. 7, an integrated circuit structure 700 includes a NMOS region 702 and a PMOS region 704. The NMOS region includes NMOS gate electrodes 706 and intervening contacts 708. The PMOS region includes PMOS gate electrodes 710 and intervening contacts 712. Conductive spines are in the form of an inner conductive plug 714A and outer conductive plugs 714B.

Referring again to FIG. 7, an integrated circuit structure 750 includes a NMOS region 752 and a PMOS region 754. The NMOS region includes NMOS gate electrodes 756 and intervening contacts 758. The PMOS region includes PMOS gate electrodes 760 and intervening contacts 762. Conductive spines are in the form of an inner conductive plane 764A and outer conductive planes 764B.

In an embodiment, the conductive material is a metal, graphene, or doped semiconductors such as poly Si or amorphous Si. Also, depending on the circuit layout, the conducting materials can be filled into a plug or a plane. In some cases, a plug may be preferred to avoid parasitic capacitance between the wall and the source/drain materials. However, in other cases, a plane may be preferred because a conductive wall provides another routing path from the front side of the wafer to the backside of the wafer. Also, in an embodiment, the Faraday plane is in parallel to the fins, but the Faraday plug is only made in the certain locations of the poly gates.

Figure 8A:
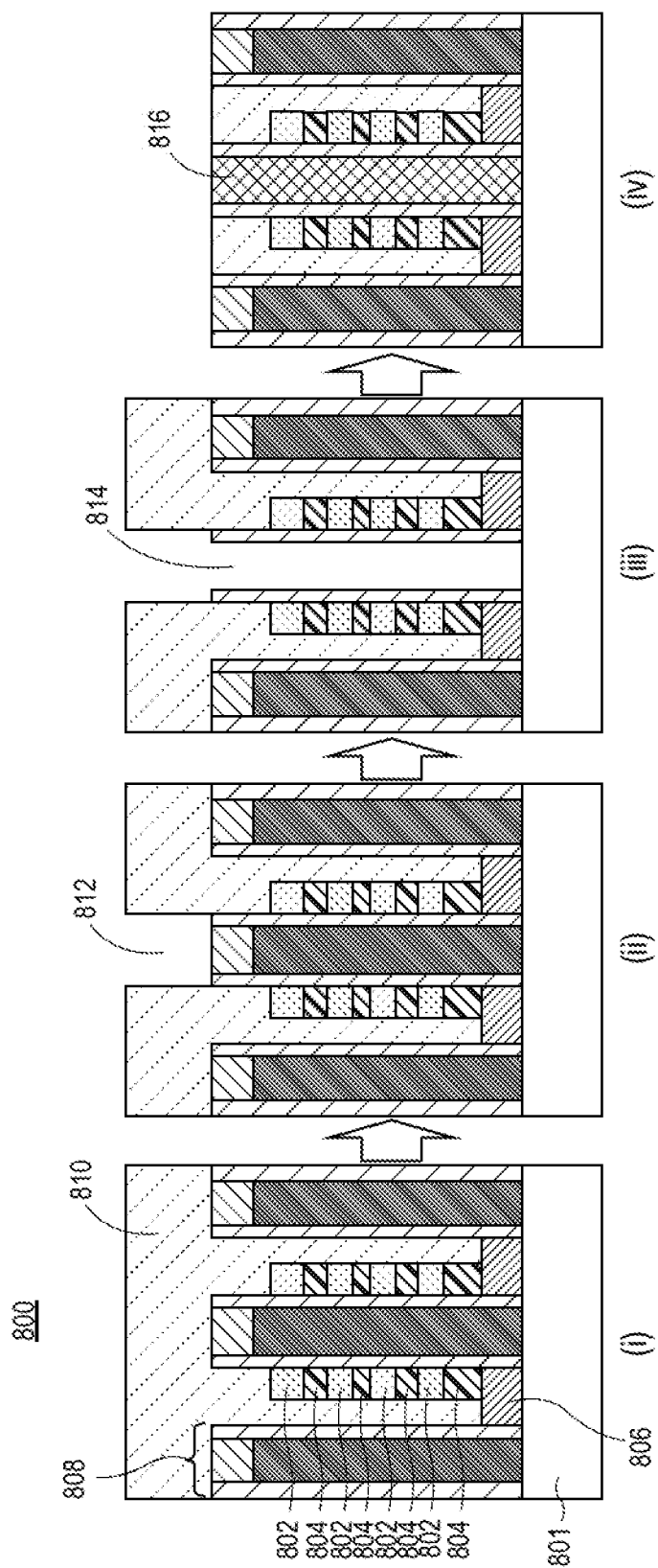
FIG. 8A illustrates cross-sectional views representing various operations in a method of fabricating an integrated circuit structure including a forksheet transistor with a conductive spine, in accordance with an embodiment of the present disclosure.

The Faraday shield plug process can be implemented by etching a poly cut, removing the dielectric wall, and filling the conductive material into the wall. The conductive wall can be grounded from the front side of the interconnect or the backside of interconnect. FIG. 8A illustrates cross-sectional views representing various operations in a method of fabricating an integrated circuit structure including a forksheet transistor with a conductive spine, in accordance with an embodiment of the present disclosure.

Referring to part (i) of FIG. 8A, a starting structure 800 includes stacks of nanowires or nanoribbons 802 and intervening sacrificial layers 804 above an oxide layer 806 above a substrate 801. Dielectric structures 808 are outside of and between the stacks of nanowires or nanoribbons 802. A sacrificial gate material 810, such as a polysilicon material, is over the stacks of nanowires or nanoribbons 802 and intervening sacrificial layers 804 and the dielectric structures 808. Referring to part (ii) of FIG. 8A, an opening 812 is formed in the sacrificial gate material 810. Referring to part (iii) of FIG. 8A, a dielectric wall is removed from the dielectric structure 808 through the opening 812. Referring to part (iv) of FIG. 8A, a conductive spine 816 is formed in place of the removed dielectric wall.

A Faraday shield plane can be fabricated post fin patterning. In an example, FIG. 8B illustrates cross-sectional views representing various operations in a method of fabricating an integrated circuit structure including a forksheet transistor with a conductive spine, in accordance with an embodiment of the present disclosure.

Figure 8B:
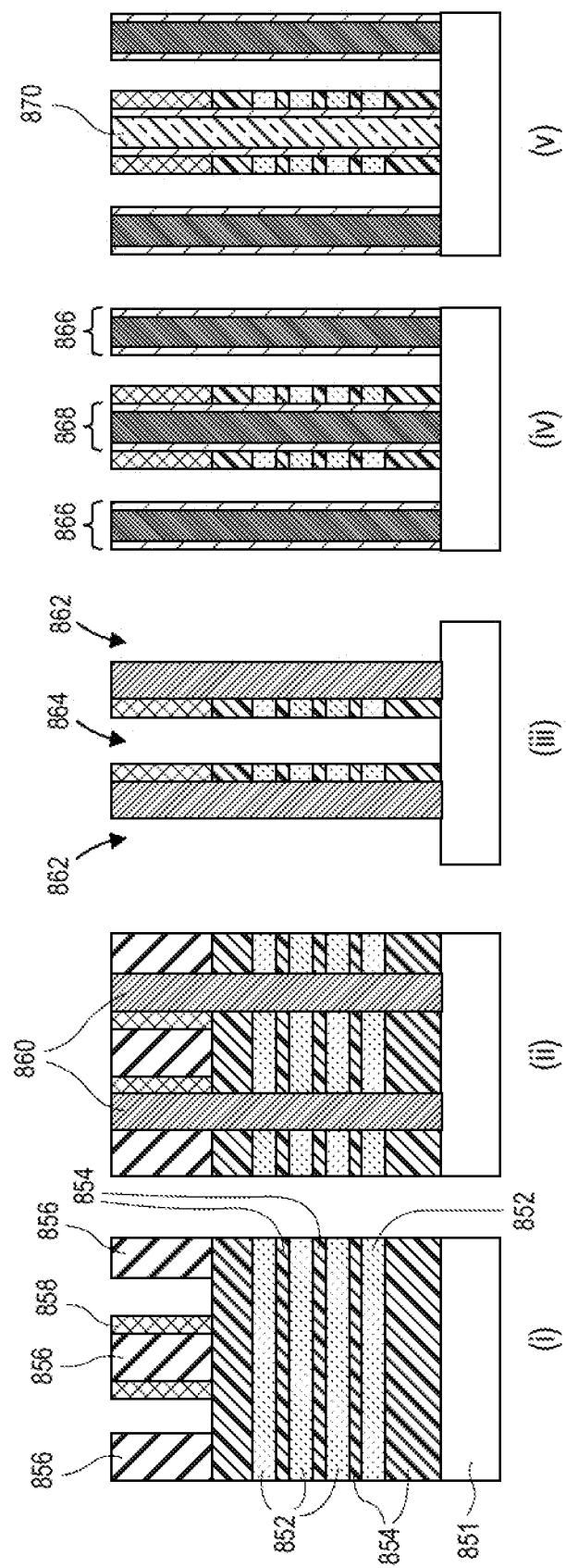
FIG. 8B illustrates cross-sectional views representing various operations in a method of fabricating an integrated circuit structure including a forksheet transistor with a conductive spine, in accordance with an embodiment of the present disclosure.

Referring to part (i) of FIG. 8B, a starting structure includes a stack of nanowires or nanoribbons 852 and intervening sacrificial layers 854 above a substrate 851. A fin hardmask 856 is over the stack of nanowires or nanoribbons 852 and intervening sacrificial layers 854. A central fin portion has spacers 858 thereon. Referring to part (ii) of FIG. 8B, the stack of nanowires or nanoribbons 852 and intervening sacrificial layers 854 is etched to form openings which are ultimately filled with a sacrificial hardmask 860, such as a carbon hardmask. Referring to part (iii) of FIG. 8B, the structure of part (ii) is subjected to a wall etch to form outer openings 862 and an inner opening 864. Referring to part (iv) of FIG. 8B, an inner dielectric wall 868 is formed in inner opening 864. Outer dielectric walls 866 are formed in outer openings 866. The sacrificial hardmask 860 is then removed. Referring to part (v) of FIG. 8B, the inner dielectric wall 868 is replaced with a conductive spine 870.

In an embodiment, an underlying semiconductor substrate as described herein represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials.

It is to be appreciated that, in a particular embodiment, channel layers (or corresponding release layers) of a plurality of nanowires (or nanoribbons) may be composed of silicon. As used throughout, a silicon layer may be used to describe a silicon material composed of a very substantial amount of, if not all, silicon. However, it is to be appreciated that, practically, 100% pure Si may be difficult to form and, hence, could include a tiny percentage of carbon, germanium or tin. Such impurities may be included as an unavoidable impurity or component during deposition of Si or may "contaminate" the Si upon diffusion during post deposition processing. As such, embodiments described herein directed to a silicon layer may include a silicon layer that contains a relatively small amount, e.g., "impurity" level, non-Si atoms or species, such as Ge, C or Sn. It is to be appreciated that a silicon layer as described herein may be undoped or may be doped with dopant atoms such as boron, phosphorous or arsenic.

It is to be appreciated that, in a particular embodiment, channel layers (or corresponding release layers) of a plurality of nanowires (or nanoribbons) may be composed of silicon germanium. As used throughout, a silicon germanium layer may be used to describe a silicon germanium material composed of substantial portions of both silicon and germanium, such as at least 5% of both. In some embodiments, the (atomic) amount of germanium is the same or substantially the same as the amount of silicon (e.g., $Si_{50}Ge_{50}$). In some embodiments, the amount of germanium is greater than the amount of silicon. In particular embodiments, a silicon germanium layer includes approximately 60% germanium and approximately 40% silicon ($Si_{40}Ge_{60}$). In other embodiments, the amount of silicon is greater than the amount of germanium. In particular embodiments, a silicon germanium layer includes approximately 30% germanium and approximately 70% silicon ($Si_{70}Ge_{30}$). It is to be appreciated that, practically, 100% pure silicon germanium (referred to generally as SiGe) may be difficult to form and, hence, could include a tiny percentage of carbon or tin. Such impurities may be included as an unavoidable impurity or component during deposition of SiGe or may "contaminate" the SiGe upon diffusion during post deposition processing. As such, embodiments described herein directed to a silicon germanium layer may include a silicon germanium layer that contains a relatively small amount, e.g., "impurity" level, non-Ge and non-Si atoms or species, such as carbon or tin. It is to be appreciated that a silicon germanium layer as described herein may be undoped or may be doped with dopant atoms such as boron, phosphorous or arsenic.

It is to be appreciated that, in a particular embodiment, channel layers (or corresponding release layers) of a plurality of nanowires (or nanoribbons) may be composed of germanium. As used throughout, a germanium layer may be used to describe a germanium material composed of a very substantial amount of, if not all, germanium. However, it is to be appreciated that, practically, 100% pure Ge may be difficult to form and, hence, could include a tiny percentage of carbon, silicon or tin. Such impurities may be included as an unavoidable impurity or component during deposition of Ge or may "contaminate" the Ge upon diffusion during post deposition processing. As such, embodiments described herein directed to a germanium layer may include a germanium layer that contains a relatively small amount, e.g., "impurity" level, non-Ge atoms or species, such as Si, C or Sn. It is to be appreciated that a germanium layer as described herein may be undoped or may be doped with dopant atoms such as boron, phosphorous or arsenic.

It is to be appreciated that although some embodiments describe the use of Si or SiGe (wire or ribbon) and complementary Si or SiGe (sacrificial) layers, other pairs of semiconductor materials which can be alloyed and grown epitaxially could be implemented to achieve various embodiments herein, for example, InAs and InGaAs.

In an embodiment, source or drain structures are fabricated from silicon alloy formed using a selective epitaxial deposition process. In some implementations, the silicon alloy may be in-situ doped silicon germanium, in-situ doped silicon carbide, or in-situ doped silicon. In alternate implementations, other silicon alloys may be used. For instance, alternate silicon alloy materials that may be used include, but are not limited to, nickel silicide, titanium silicide, cobalt silicide, and possibly may be doped with one or more of boron and/or aluminum.

In an embodiment, dielectric spacers may separate a gate electrode from source or drain structures. The nanowire channels may pass through the spacers to connect to the source or drain structures on either side of the nanowire channels. In an embodiment, a gate dielectric surrounds the perimeter of exposed portions of the nanowire or nanoribbon channels. The gate dielectric may be, for example, any suitable oxide such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

In some embodiments, an annealing process may be carried out on the gate dielectric layer to improve its quality when a high-k material is used.

In an embodiment, a gate electrode surrounds the gate dielectric layer. It is to be appreciated that a gate electrode may include a workfunction metal over the gate dielectric layer and a gate fill metal. When the workfunction metal will serve as an N-type workfunction metal, the workfunction metal of the gate electrode preferably has a workfunction that is between about 3.9 eV and about 4.2 eV. N-type materials that may be used to form the metal of the gate electrode include, but are not limited to, hafnium, zirconium, titanium, tantalum, aluminum, and metal carbides that include these elements, i.e., titanium carbide, zirconium carbide, tantalum carbide, hafnium carbide and aluminum carbide. When the workfunction metal will serve as a P-type workfunction metal, workfunction metal of the gate electrode preferable has a workfunction that is between about 4.9 eV and about 5.2 eV. P-type materials that may be used to form the metal of the gate electrode include, but are not limited to, ruthenium, palladium, platinum, cobalt, nickel, and conductive metal oxides, e.g., ruthenium oxide.

In the illustrated embodiment, each distinct transistor is shown as having three or four nanowire or nanoribbon channels. However, it is to be appreciated that each transistor may include any number of nanowire or nanoribbon channels in accordance with various embodiments.

In another aspect, integrated circuit structures described herein may be fabricated using a back-side reveal of front-side structures fabrication approach. In some exemplary embodiments, reveal of the back-side of a transistor or other device structure entails wafer-level back-side processing. In contrast to a conventional through-Silicon via TSV-type technology, a reveal of the back-side of a transistor as described herein may be performed at the density of the device cells, and even within sub-regions of a device. Furthermore, such a reveal of the back-side of a transistor may be performed to remove substantially all of a donor substrate upon which a device layer was disposed during front-side device processing. As such, a microns-deep TSV becomes unnecessary with the thickness of semiconductor in the device cells following a reveal of the back-side of a transistor potentially being only tens or hundreds of nanometers.

Reveal techniques described herein may enable a paradigm shift from "bottom-up" device fabrication to "center-out" fabrication, where the "center" is any layer that is employed in front-side fabrication, revealed from the back-side, and again employed in back-side fabrication. Processing of both a front-side and revealed back-side of a device structure may address many of the challenges associated with fabricating 3D ICs when primarily relying on front-side processing.

A reveal of the back-side of a transistor approach may be employed for example to remove at least a portion of a carrier layer and intervening layer of a donor-host substrate assembly. The process flow begins with an input of a donor-host substrate assembly. A thickness of a carrier layer in the donor-host substrate is polished (e.g., CMP) and/or etched with a wet or dry (e.g., plasma) etch process. Any grind, polish, and/or wet/dry etch process known to be suitable for the composition of the carrier layer may be employed. For example, where the carrier layer is a group IV semiconductor (e.g., silicon) a CMP slurry known to be suitable for thinning the semiconductor may be employed.

Likewise, any wet etchant or plasma etch process known to be suitable for thinning the group IV semiconductor may also be employed.

In some embodiments, the above is preceded by cleaving the carrier layer along a fracture plane substantially parallel to the intervening layer. The cleaving or fracture process may be utilized to remove a substantial portion of the carrier layer as a bulk mass, reducing the polish or etch time needed to remove the carrier layer. For example, where a carrier layer is 400-900 μm in thickness, 100-700 μm may be cleaved off by practicing any blanket implant known to promote a wafer-level fracture. In some exemplary embodiments, a light element (e.g., H, He, or Li) is implanted to a uniform target depth within the carrier layer where the fracture plane is desired. Following such a cleaving process, the thickness of the carrier layer remaining in the donor-host substrate assembly may then be polished or etched to complete removal. Alternatively, where the carrier layer is not fractured, the grind, polish and/or etch operation may be employed to remove a greater thickness of the carrier layer.

Next, exposure of an intervening layer is detected. Detection is used to identify a point when the back-side surface of the donor substrate has advanced to nearly the device layer. Any endpoint detection technique known to be suitable for detecting a transition between the materials employed for the carrier layer and the intervening layer may be practiced. In some embodiments, one or more endpoint criteria are based on detecting a change in optical absorbance or emission of the back-side surface of the donor substrate during the polishing or etching performed. In some other embodiments, the endpoint criteria are associated with a change in optical absorbance or emission of byproducts during the polishing or etching of the donor substrate back-side surface. For example, absorbance or emission wavelengths associated with the carrier layer etch byproducts may change as a function of the different compositions of the carrier layer and intervening layer. In other embodiments, the endpoint criteria are associated with a change in mass of species in byproducts of polishing or etching the back-side surface of the donor substrate. For example, the byproducts of processing may be sampled through a quadrupole mass analyzer and a change in the species mass may be correlated to the different compositions of the carrier layer and intervening layer. In another exemplary embodiment, the endpoint criteria is associated with a change in friction between a back-side surface of the donor substrate and a polishing surface in contact with the back-side surface of the donor substrate.

Detection of the intervening layer may be enhanced where the removal process is selective to the carrier layer relative to the intervening layer as non-uniformity in the carrier removal process may be mitigated by an etch rate delta between the carrier layer and intervening layer. Detection may even be skipped if the grind, polish and/or etch operation removes the intervening layer at a rate sufficiently below the rate at which the carrier layer is removed. If an endpoint criteria is not employed, a grind, polish and/or etch operation of a predetermined fixed duration may stop on the intervening layer material if the thickness of the intervening layer is sufficient for the selectivity of the etch process. In some examples, the carrier etch rate: intervening layer etch rate is 3:1-10:1, or more.

Upon exposing the intervening layer, at least a portion of the intervening layer may be removed. For example, one or more component layers of the intervening layer may be removed. A thickness of the intervening layer may be removed uniformly by a polish, for example. Alternatively, a thickness of the intervening layer may be removed with a masked or blanket etch process. The process may employ the same polish or etch process as that employed to thin the carrier, or may be a distinct process with distinct process parameters. For example, where the intervening layer provides an etch stop for the carrier removal process, the latter operation may employ a different polish or etch process that favors removal of the intervening layer over removal of the device layer. Where less than a few hundred nanometers of intervening layer thickness is to be removed, the removal process may be relatively slow, optimized for across-wafer uniformity, and more precisely controlled than that employed for removal of the carrier layer. A CMP process employed may, for example employ a slurry that offers very high selectively (e.g., 100:1-300:1, or more) between semiconductor (e.g., silicon) and dielectric material (e.g., SiO) surrounding the device layer and embedded within the intervening layer, for example, as electrical isolation between adjacent device regions.

For embodiments where the device layer is revealed through complete removal of the intervening layer, back-side processing may commence on an exposed back-side of the device layer or specific device regions there in. In some embodiments, the back-side device layer processing includes a further polish or wet/dry etch through a thickness of the device layer disposed between the intervening layer and a device region previously fabricated in the device layer, such as a source or drain region.

In some embodiments where the carrier layer, intervening layer, or device layer back-side is recessed with a wet and/or plasma etch, such an etch process may be a patterned etch or a materially selective etch that imparts significant non-planarity or topography into the device layer back-side surface. As described further below, the patterning may be within a device cell (i.e., "intra-cell" patterning) or may be across device cells (i.e., "inter-cell" patterning). In some patterned etch embodiments, at least a partial thickness of the intervening layer is employed as a hard mask for back-side device layer patterning. Hence, a masked etch process may preface a correspondingly masked device layer etch.

The above described processing scheme may result in a donor-host substrate assembly that includes IC devices that have a back-side of an intervening layer, a back-side of the device layer, and/or back-side of one or more semiconductor regions within the device layer, and/or front-side metallization revealed. Additional back-side processing of any of these revealed regions may then be performed during downstream processing.

Figure 9:
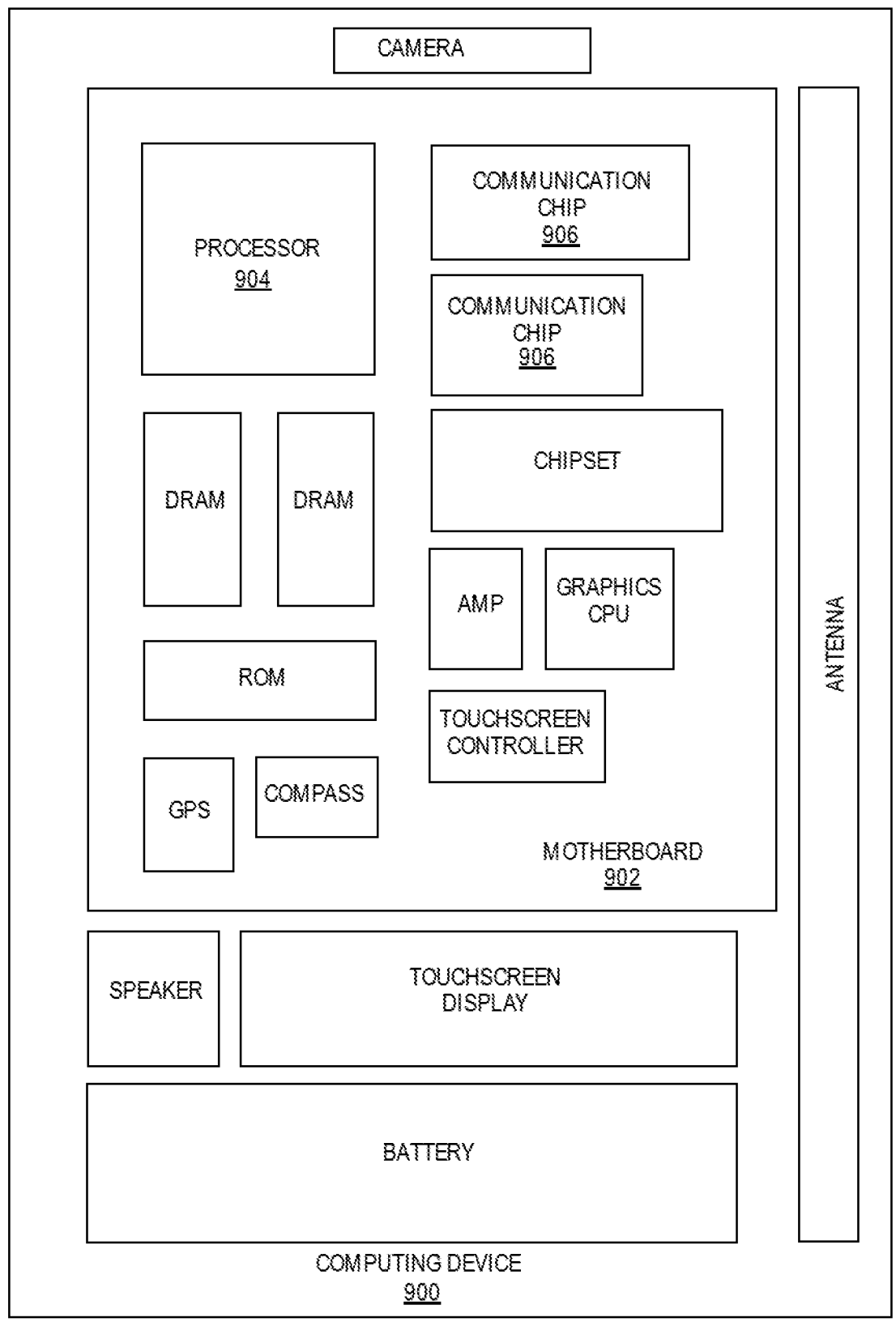
FIG. 9 illustrates a computing device in accordance with one implementation of an embodiment of the disclosure.

FIG. 9 illustrates a computing device 900 in accordance with one implementation of an embodiment of the disclosure. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In an embodiment, the integrated circuit die of the processor 904 may include forksheet transistors having a dielectric or a conductive spine, such as those described herein. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In an embodiment, the integrated circuit die of the communication chip 906 may include forksheet transistors having a dielectric or a conductive spine, such as those described herein.

In further implementations, another component housed within the computing device 900 may include forksheet transistors having a dielectric or a conductive spine, such as those described herein.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Figure 10:
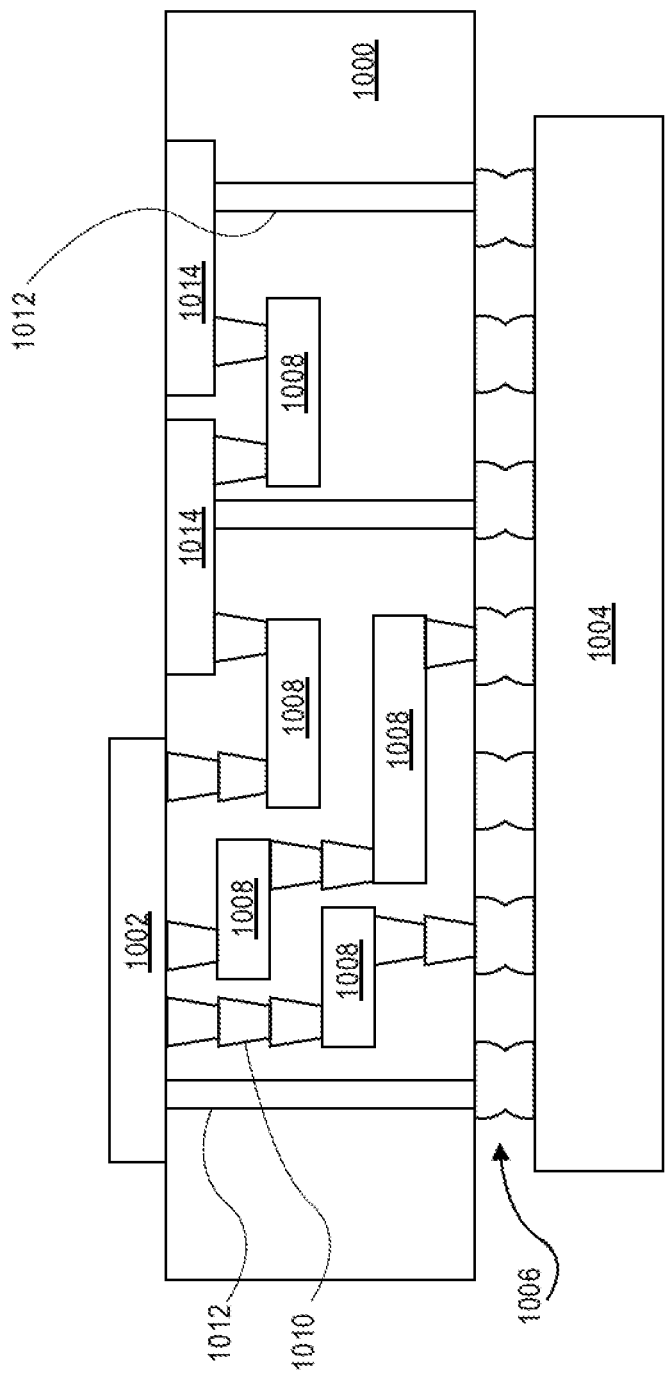
FIG. 10 is an interposer implementing one or more embodiments of the disclosure.

FIG. 10 illustrates an interposer 1000 that includes one or more embodiments of the disclosure. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, or another integrated circuit die. In an embodiment, one of both of the first substrate 1002 and the second substrate 1004 may include forksheet transistors having a dielectric or a conductive spine, in accordance with embodiments described herein. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1004 are attached to opposing sides of the interposer 1000. In other embodiments, the first and second substrates 1002/1004 are attached to the same side of the interposer 1000. And in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer 1000 may be formed of alternate rigid or flexible materials that may include the same materials described above for use in a semiconductor substrate, such as silicon, germanium, and other group III-V and group IV materials The interposer 1000 may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000. In accordance with embodiments of the disclosure, apparatuses or processes disclosed herein may be used in the fabrication of interposer 1000.

Thus, embodiments of the present disclosure may include forksheet transistors having a dielectric or a conductive spine, and methods of fabricating forksheet transistors having a dielectric or a conductive spine.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes a dielectric spine. A first transistor device includes a first vertical stack of semiconductor channels spaced apart from a first edge of the dielectric spine. A second transistor device includes a second vertical stack of semiconductor channels spaced apart from a second edge of the dielectric spine. An N-type gate structure is on the first vertical stack of semiconductor channels, a portion of the N-type gate structure laterally between and in contact with the first edge of the dielectric spine and the semiconductor channels of the first vertical stack of semiconductor channels. A P-type gate structure is on the second vertical stack of semiconductor channels, a portion of the P-type gate structure laterally between and in contact with the second edge of the dielectric spine and the semiconductor channels of the second vertical stack of semiconductor channels.

Example embodiment 2: The integrated circuit structure of example embodiment 1, wherein the first and second vertical stacks of semiconductor channels are first and second stacks of nanoribbons or nanowires.

Example embodiment 3: The integrated circuit structure of example embodiment 1 or 2, wherein a total number of semiconductor channels in the first vertical stack of semiconductor channels is the same as a total number of semiconductor channels in the second vertical stack of semiconductor channels.

Example embodiment 4: The integrated circuit structure of example embodiment 1 or 2, wherein a total number of semiconductor channels in the first vertical stack of semiconductor channels is different than a total number of semiconductor channels in the second vertical stack of semiconductor channels.

Example embodiment 5: An integrated circuit structure includes a conductive spine. First and second dielectric spacers are along first and second edges of the conductive spine, respectively. A first transistor device includes a first vertical stack of semiconductor channels adjacent to the first dielectric spacer along the first edge of the conductive spine. A second transistor device includes a second vertical stack of semiconductor channels adjacent to the second dielectric spacer along the second edge of the conductive spine.

Example embodiment 6: The integrated circuit structure of example embodiment 5, wherein the first transistor device is a P-type device, and the second transistor device is an N-type device.

Example embodiment 7: The integrated circuit structure of example embodiment 5 or 6, wherein the first and second vertical stacks of semiconductor channels are first and second stacks of nanoribbons or nanowires.

Example embodiment 8: The integrated circuit structure of example embodiment 5, 6 or 7, wherein a total number of semiconductor channels in the first vertical stack of semiconductor channels is the same as a total number of semiconductor channels in the second vertical stack of semiconductor channels.

Example embodiment 9: The integrated circuit structure of example embodiment 5, 6 or 7, wherein a total number of semiconductor channels in the first vertical stack of semiconductor channels is different than a total number of semiconductor channels in the second vertical stack of semiconductor channels.

Example embodiment 10: The integrated circuit structure of example embodiment 5, 6, 7, 8 or 9, further including a first gate structure on the first vertical stack of semiconductor channels, the first gate structure including a first gate electrode and a first gate dielectric, and a second gate structure on the second vertical stack of semiconductor channels, the second gate structure including a second gate electrode and a second gate dielectric.

Example embodiment 11: A computing device includes a board, and a component coupled to the board. The component includes an integrated circuit structure including a dielectric spine. A first transistor device includes a first vertical stack of semiconductor channels spaced apart from a first edge of the dielectric spine. A second transistor device includes a second vertical stack of semiconductor channels spaced apart from a second edge of the dielectric spine. An N-type gate structure is on the first vertical stack of semiconductor channels, a portion of the N-type gate structure laterally between and in contact with the first edge of the dielectric spine and the semiconductor channels of the first vertical stack of semiconductor channels. A P-type gate structure is on the second vertical stack of semiconductor channels, a portion of the P-type gate structure laterally between and in contact with the second edge of the dielectric spine and the semiconductor channels of the second vertical stack of semiconductor channels.

Example embodiment 12: The computing device of example embodiment 11, further including a memory coupled to the board.

Example embodiment 13: The computing device of example embodiment 11 or 12, further including a communication chip coupled to the board.

Example embodiment 14: The computing device of example embodiment 11, 12 or 13, further including a camera coupled to the board.

Example embodiment 15: The computing device of example embodiment 11, 12, 13 or 14, wherein the component is a packaged integrated circuit die.

Example embodiment 16: A computing device includes a board, and a component coupled to the board. The component includes an integrated circuit structure including a conductive spine. First and second dielectric spacers are along first and second edges of the conductive spine, respectively. A first transistor device includes a first vertical stack of semiconductor channels adjacent to the first dielectric spacer along the first edge of the conductive spine. A second transistor device includes a second vertical stack of semiconductor channels adjacent to the second dielectric spacer along the second edge of the conductive spine.

Example embodiment 17: The computing device of example embodiment 16, further including a memory coupled to the board.

Example embodiment 18: The computing device of example embodiment 16 or 17, further including a communication chip coupled to the board.

Example embodiment 19: The computing device of example embodiment 16, 17 or 18, further including a camera coupled to the board.

Example embodiment 20: The computing device of example embodiment 16, 17, 18 or 19, wherein the component is a packaged integrated circuit die.

What is claimed is:

1. An integrated circuit structure, comprising:
   a dielectric spine;
   a first transistor device comprising a first vertical stack of semiconductor channels spaced apart from a first edge of the dielectric spine;
   a second transistor device comprising a second vertical stack of semiconductor channels spaced apart from a second edge of the dielectric spine;
   an N-type gate structure on the first vertical stack of semiconductor channels, a portion of the N-type gate structure laterally between and in contact with the first edge of the dielectric spine and the semiconductor channels of the first vertical stack of semiconductor channels; and
   a P-type gate structure on the second vertical stack of semiconductor channels, a portion of the P-type gate structure laterally between and in contact with the second edge of the dielectric spine and the semiconductor channels of the second vertical stack of semiconductor channels.

2. The integrated circuit structure of claim 1, wherein the first and second vertical stacks of semiconductor channels are first and second stacks of nanoribbons or nanowires.

3. The integrated circuit structure of claim 1, wherein a total number of semiconductor channels in the first vertical stack of semiconductor channels is the same as a total number of semiconductor channels in the second vertical stack of semiconductor channels.

4. The integrated circuit structure of claim 1, wherein a total number of semiconductor channels in the first vertical stack of semiconductor channels is different than a total number of semiconductor channels in the second vertical stack of semiconductor channels.

5. An integrated circuit structure, comprising:
a conductive spine;
first and second dielectric spacers along first and second edges of the conductive spine, respectively;
a first transistor device comprising a first vertical stack of semiconductor channels adjacent to the first dielectric spacer along the first edge of the conductive spine; and
a second transistor device comprising a second vertical stack of semiconductor channels adjacent to the second dielectric spacer along the second edge of the conductive spine.

6. The integrated circuit structure of claim 5, wherein the first transistor device is a P-type device, and the second transistor device is an N-type device.

7. The integrated circuit structure of claim 5, wherein the first and second vertical stacks of semiconductor channels are first and second stacks of nanoribbons or nanowires.

8. The integrated circuit structure of claim 5, wherein a total number of semiconductor channels in the first vertical stack of semiconductor channels is the same as a total number of semiconductor channels in the second vertical stack of semiconductor channels.

9. The integrated circuit structure of claim 5, wherein a total number of semiconductor channels in the first vertical stack of semiconductor channels is different than a total number of semiconductor channels in the second vertical stack of semiconductor channels.

10. The integrated circuit structure of claim 5, further comprising:
a first gate structure on the first vertical stack of semiconductor channels, the first gate structure comprising a first gate electrode and a first gate dielectric; and
a second gate structure on the second vertical stack of semiconductor channels, the second gate structure comprising a second gate electrode and a second gate dielectric.

11. A computing device, comprising:
a board; and
a component coupled to the board, the component including an integrated circuit structure, comprising:
a dielectric spine;
a first transistor device comprising a first vertical stack of semiconductor channels spaced apart from a first edge of the dielectric spine;
a second transistor device comprising a second vertical stack of semiconductor channels spaced apart from a second edge of the dielectric spine;
an N-type gate structure on the first vertical stack of semiconductor channels, a portion of the N-type gate structure laterally between and in contact with the first edge of the dielectric spine and the semiconductor channels of the first vertical stack of semiconductor channels; and
a P-type gate structure on the second vertical stack of semiconductor channels, a portion of the P-type gate structure laterally between and in contact with the second edge of the dielectric spine and the semiconductor channels of the second vertical stack of semiconductor channels.

12. The computing device of claim 11, further comprising:
a memory coupled to the board.

13. The computing device of claim 11, further comprising:
a communication chip coupled to the board.

14. The computing device of claim 11, further comprising:
a camera coupled to the board.

15. The computing device of claim 11, wherein the component is a packaged integrated circuit die.

16. A computing device, comprising:
a board; and
a component coupled to the board, the component including an integrated circuit structure, comprising:
a conductive spine;
first and second dielectric spacers along first and second edges of the conductive spine, respectively;
a first transistor device comprising a first vertical stack of semiconductor channels adjacent to the first dielectric spacer along the first edge of the conductive spine; and
a second transistor device comprising a second vertical stack of semiconductor channels adjacent to the second dielectric spacer along the second edge of the conductive spine.

17. The computing device of claim 16, further comprising:
a memory coupled to the board.

18. The computing device of claim 16, further comprising:
a communication chip coupled to the board.

19. The computing device of claim 16, further comprising:
a camera coupled to the board.

20. The computing device of claim 16, wherein the component is a packaged integrated circuit die.

* * * * *